(12) United States Patent
Razeghi

(10) Patent No.: US 6,459,096 B1
(45) Date of Patent: Oct. 1, 2002

(54) MULTI QUANTUM WELL GRINSCH DETECTOR

(76) Inventor: Manijeh Razeghi, 1500 Sheridan Rd., Wilmette, IL (US) 60091

(*) Notice: Subject to any disclaimer, the term of this patent is extended or adjusted under 35 U.S.C. 154(b) by 0 days.

(21) Appl. No.: 09/526,134

(22) Filed: Mar. 15, 2000

Related U.S. Application Data

(60) Provisional application No. 60/071,427, filed on Jan. 14, 1998.

(51) Int. Cl.$^7$ .............................. H01L 33/00; H01S 3/19
(52) U.S. Cl. ........................... 257/14; 257/96; 257/101; 257/102; 257/103; 372/45
(58) Field of Search ............................ 257/14, 15, 17, 257/22, 96, 102, 103, 101; 372/43, 45, 46

(56) References Cited

U.S. PATENT DOCUMENTS

| | | | |
|---|---|---|---|
| 5,740,192 A | 4/1998 | Hatano et al. | 257/101 |
| 5,777,350 A * | 7/1998 | Nakamura et al. | 257/96 |
| 5,926,726 A | 7/1999 | Bour et al. | 438/507 |

FOREIGN PATENT DOCUMENTS

| | | | |
|---|---|---|---|
| JP | 10-150219 | * | 6/1998 |
| JP | 10-242512 | * | 9/1998 |
| JP | 2000-150959 | * | 5/2000 |

OTHER PUBLICATIONS

PCT International Search Report; PCT/US01/05060.

* cited by examiner

Primary Examiner—Minh Loan Tran
(74) Attorney, Agent, or Firm—Welsh & Katz, Ltd.

(57) ABSTRACT

A p-i-n structure for use in photo laser diodes is disclosed, being formed of an $Ga_xIn_{1-x}N/GaN$ alloy ($X=0 \rightarrow 1$). In the method of the subject invention, buffer layers of GaN are grown on a substrate and then doped. The active, confinement and confinement layers of p-type material are next grown and doped, if desired. The structure is masked and etched as required to expose a surface which is annealed. A p-type surface contact is formed on this annealed surface so as to be of sufficiently low resistance as to provide good quality performance for use in a device.

17 Claims, 7 Drawing Sheets

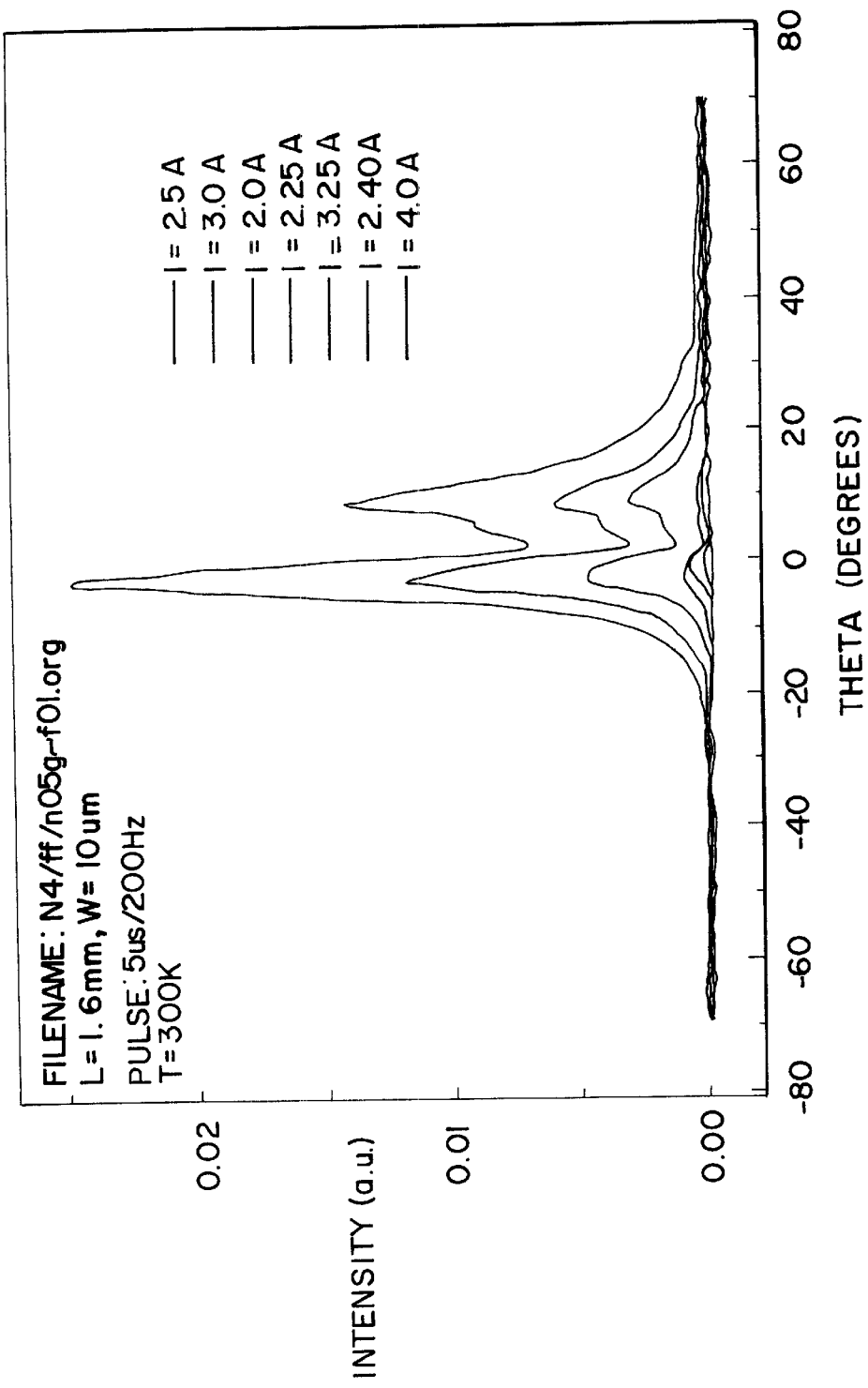

MULTI QUANTUM WELL GRINSCH DETECTOR

This application claims benefit of provisional application Ser. No. 60/071,427 filed Jan, 14, 1998.

This invention is made with government support under Contract No. BMDO/ONR-N-00014-93-1-0235, DARPA/ONR-N-00014-95-1-0983 and DARPA/ONR Contract No. N00014-96-1-0714. The government has certain rights in the invention.

FIELD OF THE INVENTION

This invention relates to semiconductor III–V alloy compounds, as well as to a method of making III–V alloy compounds for use in diode lasers.

BACKGROUND OF THE INVENTION

The importance of semiconductor emitters and detectors is rapidly increasing along with progress in the optoelectronic field, such as optical fiber communication, optical data processing, storage and solid state laser pumping.

GaN-based compounds are the most promising material system for high performance and economical ultraviolet (UV) emitters photodetectors. With a bandgap energy from 3.4 eV to 6.2 eV, UV photodetectors with cut-off wavelengths from 200 nm (AlN) to 365 nm (GaN) can be fabricated from this alloy system. The direct bandgap of $Al_xGa_{1-x}$ N-based detectors are also expected to have better intrinsic solar blindness than any other UV photodetectors. This makes them ideal for many applications, such as the surveillance and recognition of spacecraft, space-to-space communications, the monitoring of welding, as well as engines, combustion chambers, and astronomical physics.

Further, GaN, InN AlN and their alloys (III-Nitrides) have direct bandgap energies from 1.9 eV (659 nm) to 6.2 eV (200 nm, which cover almost the whole visible down to mid-ultraviolet wavelength range. Therefore, one of the most important applications of these materials is to make visible and ultraviolet light-emitting diodes (LED) and laser diodes (LD) with high quantum efficiency, which are immediately needed in the current commercial markets and can be best achieved by these materials.

The performance of photoconductors and simple p-n junction photodiodes can be very limited in terms of speed, responsivity and noise performance. The optimization of GaN-based UV photoconductors requires sophisticated structures such as p-i-n layered structures, heterostructures or even quantum wells.

To fabricate these structures and achieve high-performance photodetectors, two critical issues need to be addressed. One is the high resistance of the p-type layer and its contact, which introduce signal voltage drop and excess noise at the contact point. The other problem is introduced by the p-type layer annealing procedure. The best way to illustrate these two problems is to describe their effect on the performances of current blue laser diodes.

Currently, the demonstrated blue laser diodes are not significantly practical since they have to be operated either in pulsed mode or CW at low temperature. In addition, their lifetime is short. A typical reported blue laser diode structure is a p-n structure with a p-type layer on top. Because of the high resistance of the p-type layer and its contact, excess heating at high current densities is generated, which leads to the failure of the device. Other problems exist as a result of the growing procedure, which are as follows: First, n-type layers are grown, followed by InGaN MQW; Mg-doped layers are then grown. Finally, thermal annealing at about 700° C. or low-energy electron beam irradiation (LEEBI) is performed to convert the top GaN:Mg to p-type. Both of these procedures will deteriorate the quality of the bottom layers, including the promotion of defect and impurity propagation, interface deterioration and, worse than that, the dissociation of the InGaN active layer and interface quality of the InGaN multi-quantum-well, since InGaN begins to dissociate at temperatures above 500° C.

With regard to emitters, III-Nitride based LEDs have been recently successfully developed and commercialized, providing coverage from yellow to blue. Further, blue laser diodes are known in pulsed mode at room temperature and continuous mode at about 40° C. Blue or short-wavelength laser diodes are in demand primarily because of their immediate need in optical storage and full color flat-panel display. The optical storage density is inversely proportional to the square of the wavelength of the read-write laser diode. By simply replacing the currently used laser diode (780 nm) with blue laser diode (410 nm), the storage density can be enhanced by almost four times.

SUMMARY OF THE INVENTION

An object, therefore, of the invention is a III-Nitride alloy for use in photoconductors and diodes having high quantum efficiency.

A further object of the subject invention is a GaN-based MQW composition in a p-i-n structure of high quality.

A still further object of the subject invention is an alloy of the composition $GaN/Ga_xIn_{1-x}N$ in a standard p-i-n structure.

Those and other objects are attained by the subject invention wherein a $GaN/Ga_xIn_{1-x}N$ alloy (X=0→1) is grown by MOCVD procedure in a p-n structure (no aluminum need be present, if desired) with the n or p-type layer adjacent the substrate. In the method of the subject invention, buffer layers of n-type material are grown on a substrate. The active layers, and confinement layers of p-type material are next grown. The structure is masked and etched as required to expose a surface. An n-type surface contact is formed on this exposed surface, and a p-type surface contact is formed on the masked areas, to provide good quality device performance.

DESCRIPTION OF THE DRAWINGS

FIG. 2(b) is a description of optical pumping and stimulated emission from the structure of FIG. 1(b).

FIGS. 9(a) and 9(b) are graphs showing far field spectra for the device of the subject invention.

DETAILED DESCRIPTION OF THE INVENTION

Figure 1A:
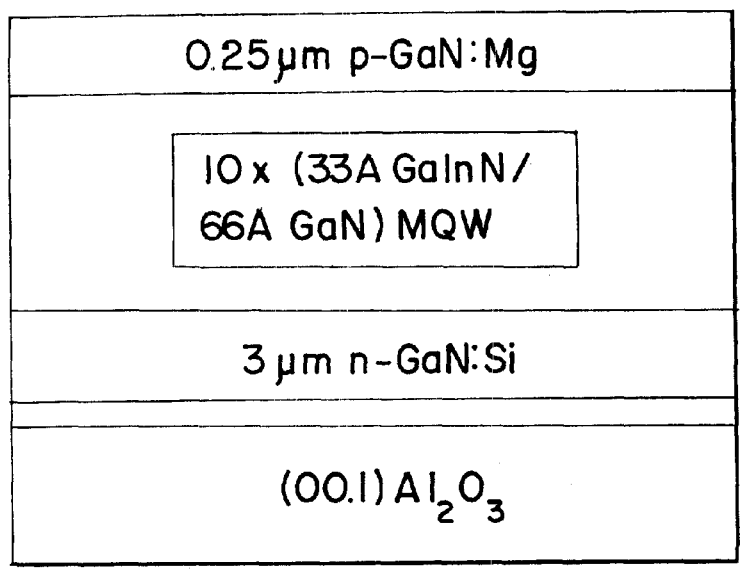
FIG. 1(a) is a cross-section of a GaN based diode structure according to the subject invention.

The reactor and associated gas-distribution scheme used herein are substantially as described in U.S. Pat. No. 5,384, 151. The system comprises a cooled quartz reaction tube pumped by a high-capacity roughing pump (120 hr$^{-1}$) to a vacuum between 7 and 760 Torr. The substrate was mounted on a pyrolytically coated graphite susceptor that was heated by rf induction. The pressure inside the reactor was measured by a mechanical gauge and the temperature by an infrared pyrometer. A molecular sieve was used to impede oil back-diffusion at the input of the pump. The working pressure was adjusted by varying the flow rate of the pump by using a control gate valve. The gas panel was classical, using ¼-inch stainless steel tubes. Flow rates were controlled by mass flow control.

The reactor was purged with a hydrogen flow of 4 liters min$^{-1}$, and the working pressure of 10–100 Torr was established by opening the gate valve that separated the pump and the reactor. The evacuation line that was used at atmospheric pressure was automatically closed by the opening of the gate valve. The gas flow rates were measured under standard conditions, i.e., 1 atm and 20° C., even when the reactor was at subatmospheric pressure.

The gas sources used in this study for the growth of GaN and GaInN by LP-MOCVD are listed below.

| Group-III Sources | Group-V Source |
| --- | --- |
| Al (CH$_3$)$_3$ | t-butylamine |
| Al (C$_2$H$_5$)$_3$ | NH$_3$ |
| In(CH$_3$)$_3$ | |
| In(C$_2$H$_5$)$_3$ | |
| (CH$_3$)$_2$In(C$_2$H$_5$) | |
| Ga(CH$_3$)$_3$ | |
| Ga(C$_{2H3}$)$_3$ | |

An accurately metered flow of purified H$_2$ or N$_2$ for TMI is passed through the appropriate bubbler. To ensure that the source material remains in vapor form, the saturated vapor that emerges from the bottle is immediately diluted by a flow of hydrogen or N$_2$. The mole fraction, and thus the partial pressure, of the source species is lower in the mixture and is prevented from condensing in the stainless steel pipe work. If necessary the active buffer and confinement layers may be prepared without the presence of aluminum.

Pure and diluted ammonia (NH$_3$) is used as a source of N. The metal alkyl or hydride flow can be either injected into the reactor or into the waste line by using two-way valves. In each case, the source flow is first switched into the waste line to establish the flow rate and then switched into the reactor. The total gas flow rate is about 8 liters mind$^{-1}$ during growth. Stable flows are achieved by the use of mass flow controllers.

Dopants usable in the method of the subject invention are as follows:

| n dopant | p dopant |
| --- | --- |
| H$_2$Se | (CH$_3$)$_2$Zn |
| H$_2$S | (C$_2$H$_5$)$_2$ Zn |
| (CH$_3$)$_3$Sn | (C$_2$H$_5$)$_2$ Be |
| (C$_2$H$_5$)$_3$Sn | (CH$_3$)$_2$Cd |
| SiH$_4$ | (ηC$_2$H$_5$)$_2$Mg |
| Si$_2$H$_6$ | Cp$_2$Mg |
| GeH$_4$ | |

Co-doping, i.e., doping with two or more dopants of like type, may be conducted.

The substrate can be GaAs, Si, Al$_2$O$_3$, MgO, SiC, ZnO, LiGaO$_2$, LiAlO$_2$, MgAl$_2$O$_4$ or GaN. Preferably, sapphire (Al$_2$O$_3$) is used as the substrate. The epitaxial layer quality is sensitive to the pretreatment of the substrate and the alloy composition. Pretreatment of the substrates prior to epitaxial growth was thus found to be beneficial. One such pretreatment procedure is as follows:

1. Dipping in H$_2$SO$_4$ for 3 minutes with ultrasonic agitation;
2. Rinsing in Deionized H$_2$O;
3. Rinsing in hot methanol;
4. Dipping in 3% Br in methanol at room temperature for 3 minutes (ultrasonic bath);
5. Rinsing in hot methanol;
6. Dipping in H$_2$SO$_4$ for 3 minutes;
7. Rinsing in deionized H$_2$O, and
8. Rinsing in hot methanol.

After this treatment, it is possible to preserve the substrate for one or two weeks without repeating this treatment prior to growth.

Figure 1B:
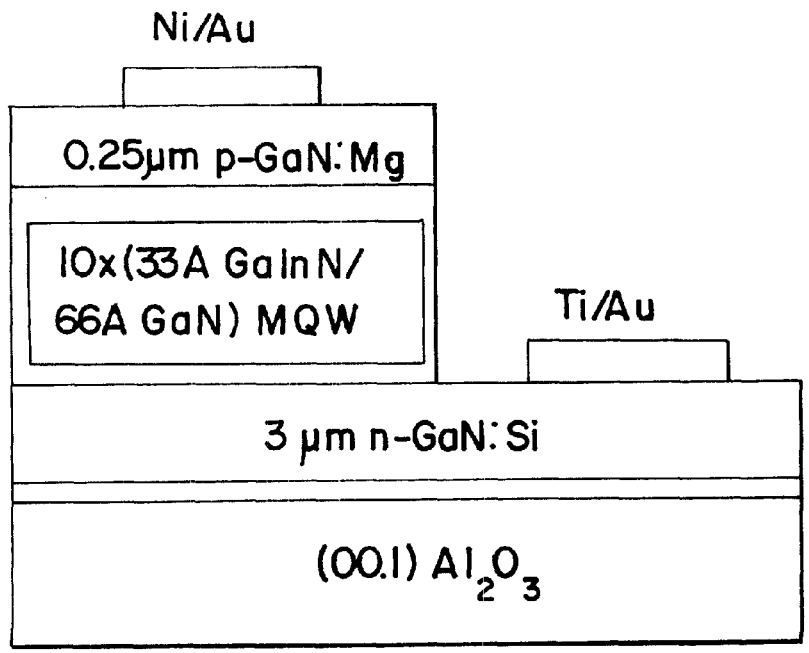
FIG. 1(b) is a cross-section of the structure of FIG. 1(a) after processing.

The invention is described in accordance with the drawings and, in particular, with respect to FIG. 1.

Growth takes place by introducing metered amounts of the group-III alkyls and the group-V hydrides into a quartz reaction tube containing a substrate placed on an rf-heated susceptor surface. The hot susceptor has a catalytic effect on the decomposition of the gaseous products; the growth rate is proportional to the flow rate of the group-III species, but is relatively independent of temperature between 700° and 1000° C. and of the partial pressure of group-V species as well. The gas molecules diffuse across the boundary layer to the substrate surface, where the metal alkyls and hydrides decompose to produce the group-III and group-V elemental species. The elemental species move on the hot surface until they find an available lattice site, where growth then occurs.

High quality GaN/GaInN may be grown in the method of the subject invention by low pressure metalorganic chemical vapor deposition (LP-MOCVD). Other forms of deposition of III–V films such as the subject invention, may be used as well including MBE (molecular beam epitaxy), MOMBE (metalorganic molecular beam epitaxy), LPE (liquid phase epitaxy and VPE (vapor phase epitaxy).

For best results, all surfaces of the growth reaction chamber are coated with a barrier coating capable of withstanding high temperatures and not reacting with the reactants and dopants utilized therein at such high temperatures. Preferably, a coating of AlN or of SiC is grown in situ in the reaction chamber to cover all surfaces therein. There is thus formed a stable layer that prevents oxygen and other impurities originating within the reaction chamber from reacting with the semiconducting layer to be grown.

High quality GaInN may be grown in the method of the subject invention by low pressure metallorganic chemical vapor deposition (LP-MOCVD). The layers of the heterostructure are grown by an induction-heated horizontal cool wall reactor. Trimethylindium (TMI), and Triethylgallium (TEG) are typically used as the sources of Indium and Gallium. Pure and diluted ammonia gas ($NH_3$) is used as the N source. Sample is typically grown on a sapphire substrate. A buffer layer of GaN and thin contact and confinement layers of GaN, and $Ga_xIn_{1-x}N$ (X=0→1) are individually laid on the substrate at thicknesses from 50 Å to a few $\mu$m. The undoped active layer may be $In_xGa_{1-x}N$ ($0 \leq x \leq 1$), preferably ($0.01 \leq x \leq 0.99$) or the superlattice structure of $GaN/Ga_xIn_{1-x}N$ ($0 \leq x \leq 1$), preferably ($0.01 \leq x \leq 0.99$). The optimum growth conditions for the respective layers are listed in Table 1. The confinement of the active layer for the subject invention may be as a heterostructure, separate confinement heterostructures or with a quantum well.

Doping is preferably conducted with bis-cyclopentadienyl magnesium ($CP_2Mg$) for p-type doping and silane ($SiH_4$) for n-type doping. Doping is performed through a $BCP_2Mg$ bubbler with $H_2$ as carrier gas and at temperatures from −15° C. to ambient temperatures at 20–500 $cm^3$ $min.^{-1}$ and onto either a hot or cooled substrate. Dilute $SiH_4$ may be simply directed at ambient temperatures onto the hot substrate at 20–90 $cm^3$ $min.^1$.

In a preferred doping method for incorporating the maximum amount of p-type dopant on the layer, once the p-type layer to be doped is fully grown, the heat source is terminated and the substrate allowed to cool; the metal and hydride sources are terminated; the dopant flow, for instance DEMg, is initiated at the temperatures indicated for diffusion onto the cooled substrate/epilayer which has been previously grown. After about 2–3 minutes, the dopant flow is terminated and the next epilayer grown. By this method, it is found that $10^{20}$ $atoms/cm^3$ of Mg may be placed on the top surface of the epilayer.

TABLE 1

Optimum growth conditions of a $Ga_xIn_{1-x}N/GaN$ structure.

|  | GaInN | GaN |
| --- | --- | --- |
| Growth Pressure | 76 | 76 |
| Growth Temperature (C) | ~800 | ~1000 |
| Total $H_2$ Flow (liter/min) | 3 | 3 |
| TMI (cc/min) | 200 | — |
| TEG (cc/min) | 120 | 120 |
| $NH_3$ (cc/min) | ~3000 | ~3000 |
| Growth Rate (Å/min) | 30 | 250 |

EXAMPLE

The epitaxial layers are grown on (0001) sapphire substrates using a horizontal flow low pressure metalorganic chemical vapor deposition (LP-MOCVD) reactor. The inductively heated SiC-coated graphite susceptor is rotated at a speed of ~50–100 rpm to achieve better uniformity films. Trimethyl-gallium (TMGa) and triethyl-gallium (TEGa) are used as the gallium (Ga) source materials, trimethyl-indium (TMIn) is used as the indium (In) source and purified ammonia (NH3) is used as the nitrogen (N) source. Bis-cyclopentadienyl-magnesium ($Cp_2Mg$) and silane ($SiH_4$) are used as the magnesium (Mg) and silicon (Si) doping source materials respectively. The carrier gases include Palladium diffused hydrogen and resin purified nitrogen.

The device structure is shown in FIG. 1(*a*). First, a thin (20–4000 Å and preferably ~200 Å) GaN buffer is grown at low temperature (~500–600° C.) on the sapphire substrate. Then, a 3 $\mu$m-thick Si-doped GaN layer is grown at ~1000° C. at a growth rate of 1.5 $\mu$m/hr using TMGa, $NH_3$, $SiH_4$ and hydrogen as the carrier gas. This layer typically exhibits a room temperature free electron concentration of $2 \times 10^{18}$ $cm^{-3}$ and mobility of 300 $cm^2$ Vs. The growth temperature was then cooled down to ~750° C., while growing Si-doped or undoped GaN and the carrier gas is switched from hydrogen to purified nitrogen. A 10 or 20 period multiple quantum well (graded-index multiple quantum well heterostructure-GRINSCH) structure is then grown using TEGa, TMIn and $NH_3$ with a growth of 0.2 $\mu$m/hr. Each period consists of Si-doped or undoped 33 Å $Ga_{0.89}In_{0.11}N$/ 66 Å GaN. Then, the growth temperature is increased to 1000° C., while growing Mg-doped GaN and while hydrogen is being re-introduced into the reaction chamber. Finally, a 0.25 $\mu$m-thick Mg-doped GaN layer is grown using TMGa, $Cp_2Mg$ and $NH_3$ at a growth rate of 1.5 $\mu$m/hr. The sample was then slowly cooled down to avoid formation of cracks. The laser structures here are different from any other reported III-Nitride based laser structure because it does not include any AlGaN cladding layer, although a AlGaN clodding layer may be used.

After epitaxial growth, the wafers are annealed using rapid thermal annealing (RTA) under nitrogen ambient for 30 seconds at 1000° C. to achieve low resistivity p-type GaN:Mg. Typically, the room temperature free hole concentration is $2 \times 10^{17}$ $cm^{-3}$ and mobility is 10 $cm^2/Vs$. Ni/Au metal contacts are deposited on the p-type GaN using an electron-beam evaporator. 10 to 100-$\mu$m wide stripes are defined by conventional photolithography and are fabricated using ECR-RF dry etching using a $SiCl_4/Ar$ chemistry. The structure is partially etched until the underlying n-type GaN:Si layer is exposed, as shown in FIG. 1(*b*). Ti/Au metal contacts are then deposited on the n-type GaN using an electron-beam evaporator. The metal contacts are defined by a conventional lift-off process known in the art.

Mirror facets for laser diodes are mechanically polished to achieve various cavity lengths from 700 $\mu$m to 1800 $\mu$m. The roughness of the facet surface is in the range of 50 nm. No antireflection or high-reflection coatings are applied on the mirror facets. The laser diodes are bonded with indium to copper heatsinks and are tested under pulse and continuous wave operation between 79° and 325° K.

Material Characterization

Figure 2:
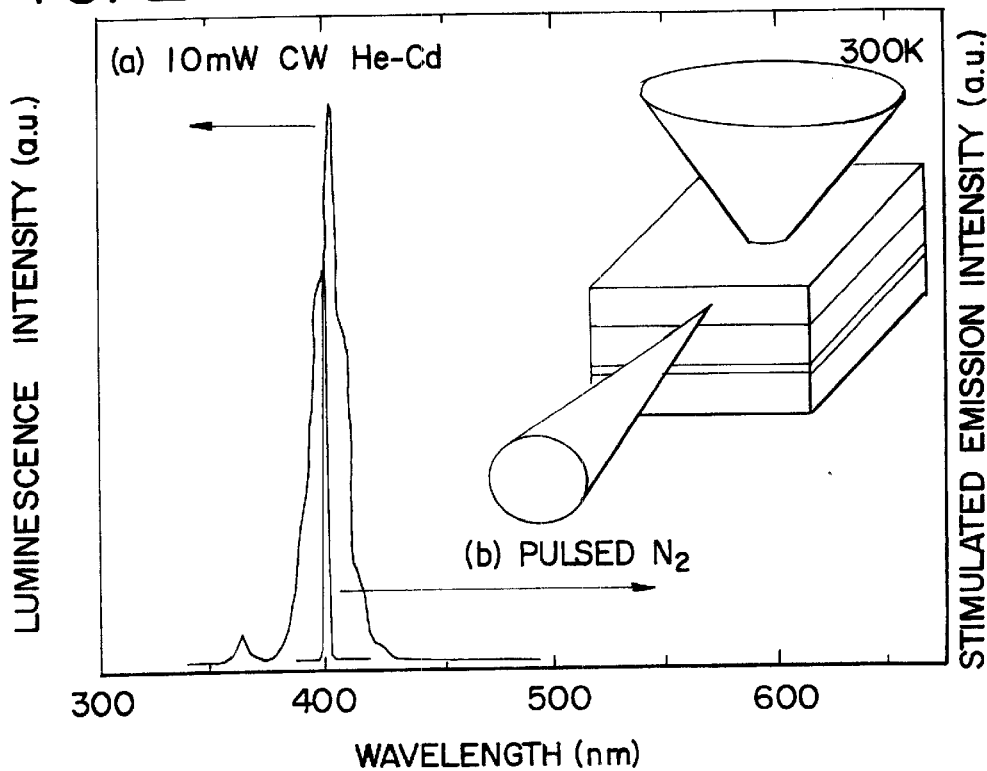
FIG. 2 is a graph showing room temperature photoluminescence and shows optical pumping and stimulated emission from teh structure of FIG. 1(b).

FIG. 2 shows the room temperature photoluminescence Peak A and optical pumping Peak B from a 10 period 33 Å $Ga_{0.89}In_{0.11}N$/66 Å GaN MQW structure capped with only a thin (~500 Å) undoped GaN layer. The photoluminescence measurements are conducted using a 10 mW continuous wave He-Cd laser (325 nm). The optical pumping is carried out using a pulsed nitrogen laser (337 nm) with a pulse width of 600 ps and a repetition rate of 6 Hz. Neutral density filters are used to attenuate the optical power. Stimulated emission is collected from a bar with mechanically polished edges and is observed for pumping densities higher than a threshold estimated at 100 $kW/cm^2$. The peak position was 401 nm and its width of ~1 nm is limited by the resolution of the measurement equipment.

Figure 3:
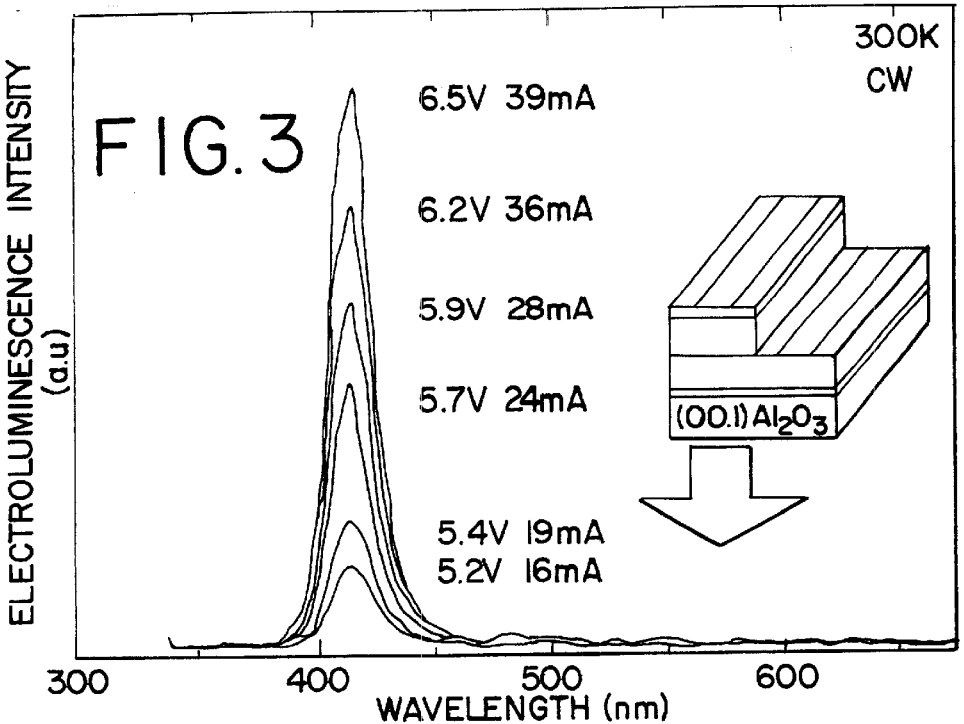
FIG. 3 is a graph showing the spectrum for the structure of FIG. 1(b).

FIG. 3 shows the room temperature electroluminescence spectrum from a laser diode for increasing injected currents under continuous wave operation. The light is collected from the substrate side of the sample. An intense electroluminescence peak at ~416 nm is observed.

Figure 4:
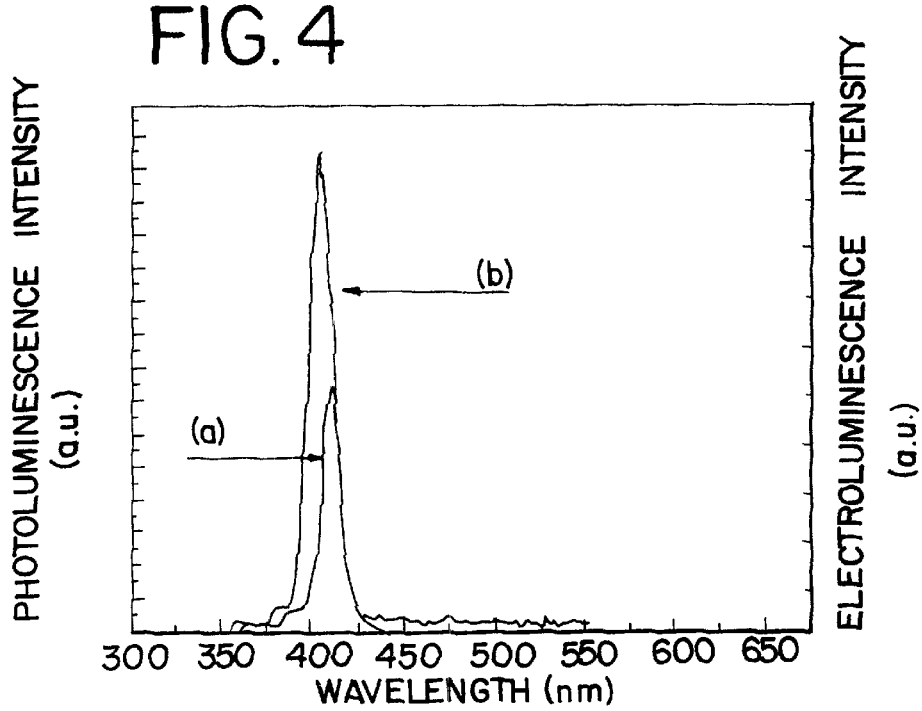
FIG. 4 is a graph showing the 79° K. electroluminescense spectrum for a GaInN/GaN MQW.

In FIG. 4, Peak (d) shows the 79° K. electroluminescence spectrum of this laser structure, exhibiting a peak at ~403 nm. Peak (c) shows the 79° K. photoluminescence of the MQW laser structure. In order to be able to detect photoluminescence from the multi-quantum wells in the laser structures, the top 0.25 μm p-type GaN:Mg layer is partially removed by dry etching to allow penetration of the laser beam. The spectrum exhibits a small peak at ~384 nm and an intense peak at 410 nm. The full width at half maximum of the peak at 410 nm is ~11 nm. This width and the presence of two peaks in the spectrum strongly suggests that there is some degree of phase separation in the MQW structure, leading to localized regions—e.g. quantum dots—which are In rich and others regions which are In deficient.

Laser Diode Testing at 79° K. Under Pulse Operation

Figure 5:
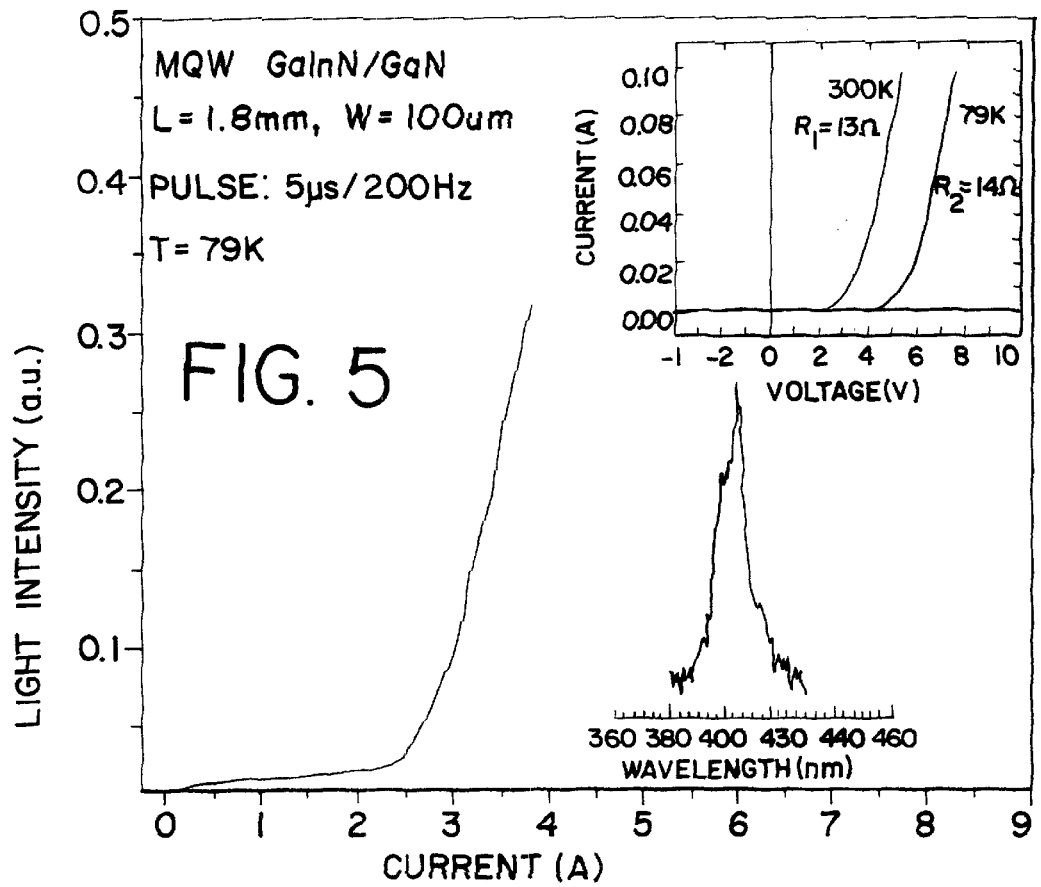
FIG. 5 is a graph of the output power vs. injection current for a MQW GaInN/GaN 405 nm uncoated diode laser at 79° K.

Pulse operation light-current characteristics are recorded at a repetition rate 200 Hz and a pulse width of 2–6 μs using a silicon detector. From the current versus voltage (I–V) curve, the series resistance of the laser (L~1800 μm) is estimated to be 13 Ω at 300° K. (turn-on voltage~3.6V) and 14 Ω (turn on voltage ~6V) at 79° K., as shown in FIG. 5. When decreasing the sample temperature from 300° to 79° K., the resistivity of the p-type GaN:Mg is expected to increase drastically, by at least two orders of magnitude, as a result of the relatively high activation energy of Mg levels in GaN. The fact that the series resistance does not increase significantly in these diodes may be directly due to the small thickness of the GaN:Mg layer, to the absence of AlGaN cladding layers or to higher p-type doping of GaN:Mg which results in lower device resistances.

Figure 6:
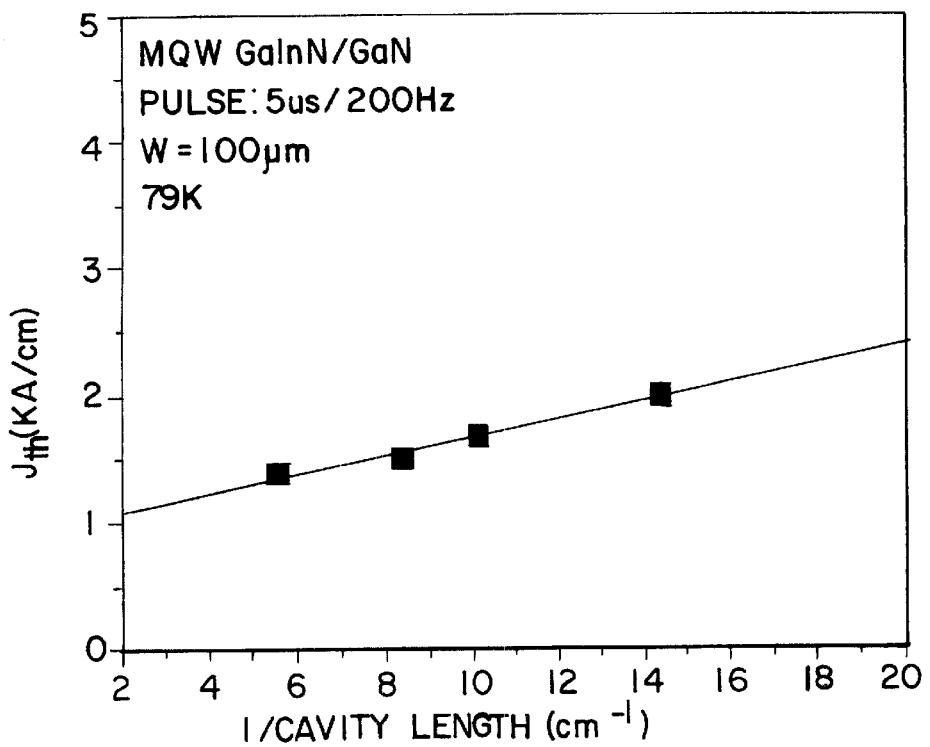
FIG. 6. is a graph of threshold current density vs. inverse cavity length for 100 $\mu$m wide GaInN/GaN MQW lasers at 75° K.

FIG. 5 illustrates the light output power versus injection current of an uncoated 1800 μm-long laser at 79° K. Stimulated emission is observed at currents of 2.5 A which corresponds to a threshold current density of 1.4 kA/cm$^2$. The voltage of this laser at threshold was 25 V. The peak wavelength of the measured lasers is 405 nm at 3.4 A as shown in FIG. 5. At currents lower than 4 A, no degradation is observed for these diodes under pulse operation. The threshold current density for several lasers of different cavity length is measured and the results are summarized in FIG. 6.

Laser Diode Testing at 300° K. Under Pulse and Continuous Wave Operation

Figure 7:
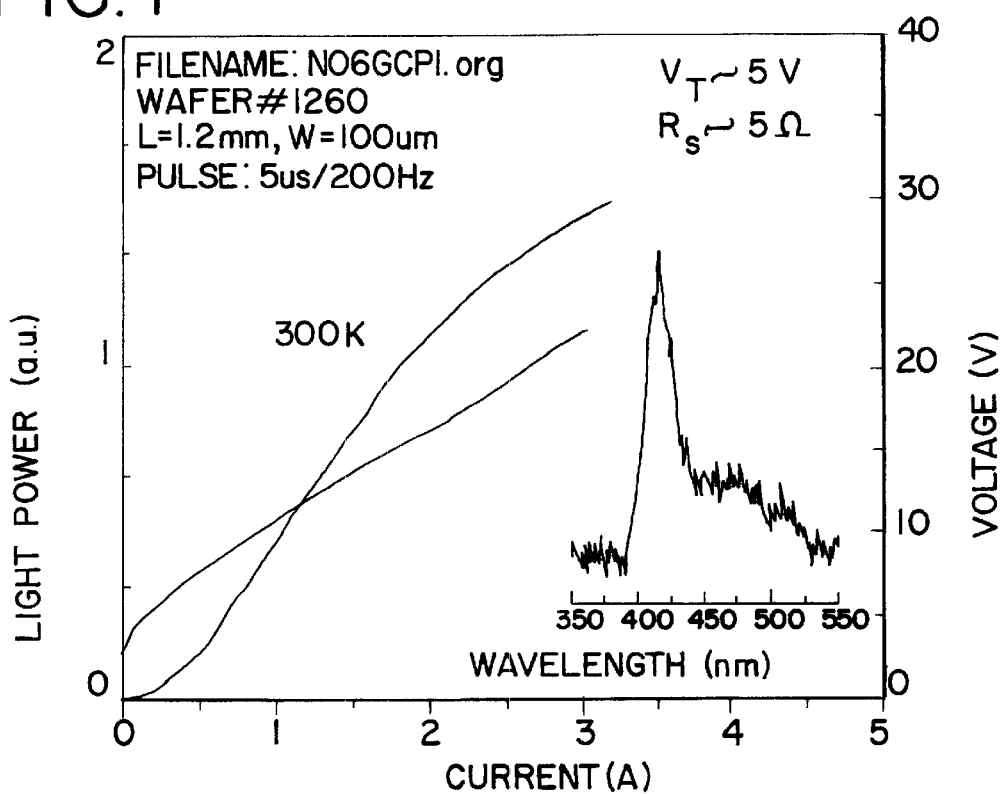
FIG. 7 is a graph of output power vs. injection current for a MQW GaInN/GaN uncoated diode at 300° K.

Pulse operation light-current characteristics are recorded at room temperature at a repetition rate 200 Hz and a pulse width of 5 μs using a silicon detector. The series resistance of the diodes is 5 Ω. FIG. 7 illustrates the light output power versus injection current of an uncoated 1200 μm-long laser at 300° K. Stimulated emission is observed at currents that correspond to a threshold current density of 300 A/cm$^2$. The voltage of this laser at threshold was 5 V. The peak wavelength of the measured lasers is 410 nm as shown in FIG. 7.

Figure 8:
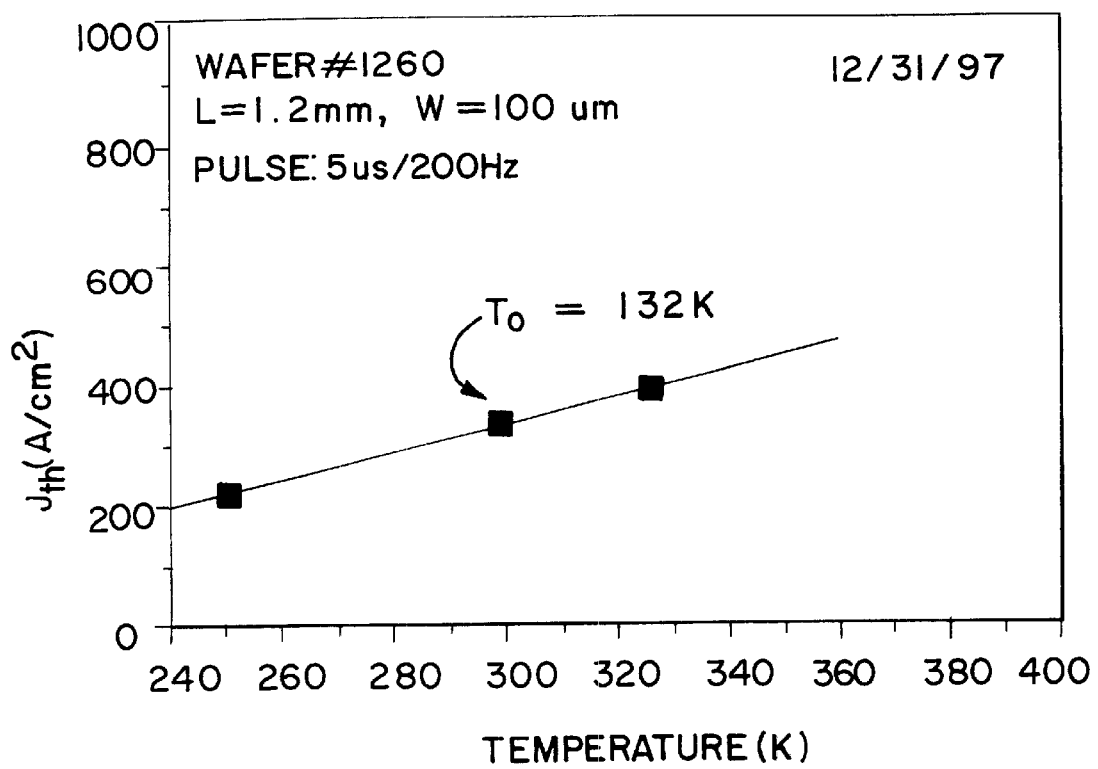
FIG. 8 is a graph showing the temperature dependence of the threshold current density of the laser of FIG. 7.
Figure 9B:
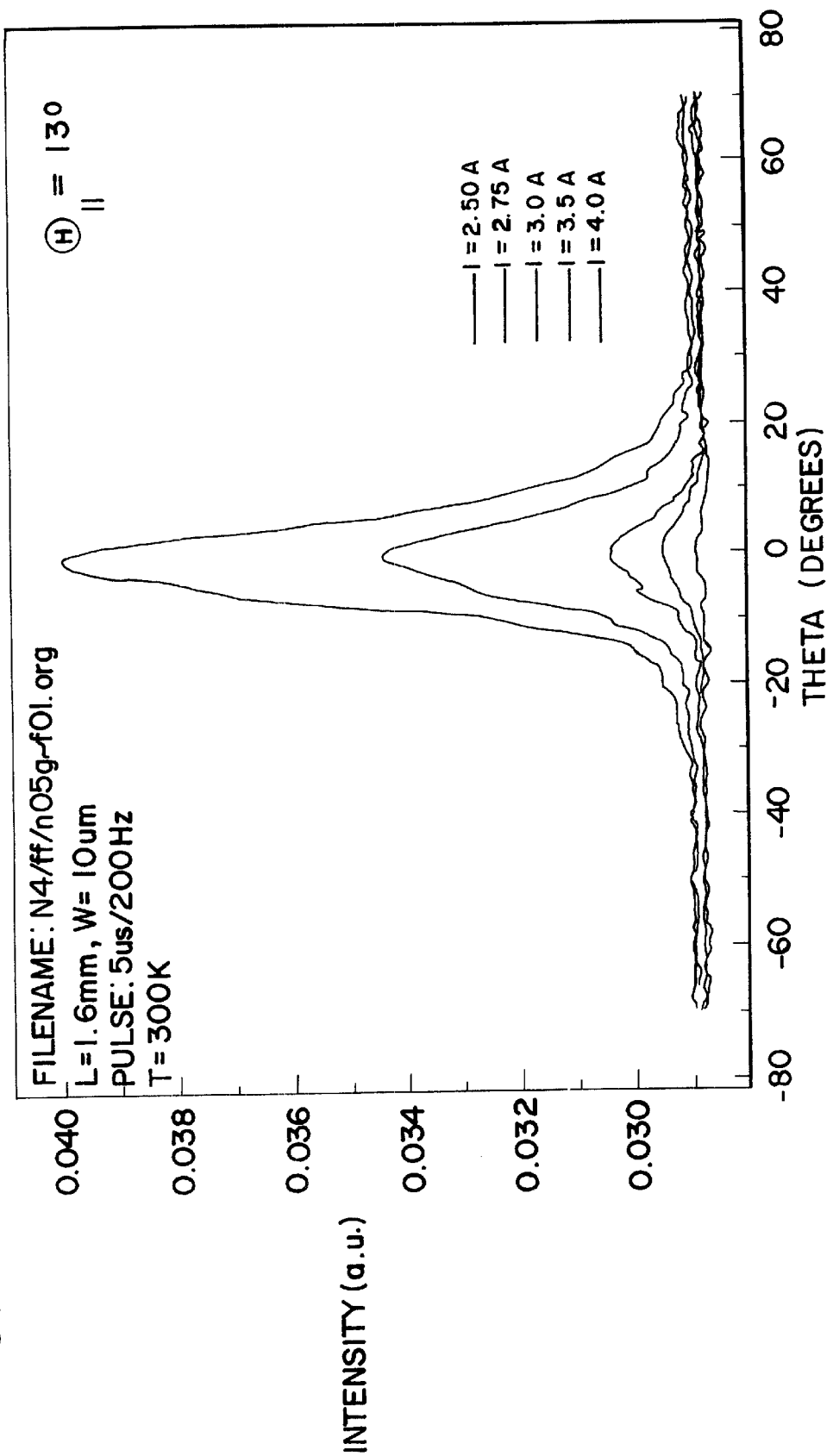

FIG. 8 shows the temperature dependence of the threshold current density. A characteristic temperature of 132° K. can be extracted. FIGS. 9(*a*) and 9(*b*) show the far-field spectra in the perpendicular and parallel directions, respectively, for a 10 μm-wide and 1.6 μm-long laser at 300° K. under pulse wave operation.

While the invention has been described with reference to a preferred embodiment, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments and equivalents.

What is claimed is:

1. A multi-quantum well laser diode comprising:
    a substrate, a buffer layer, a lower confinement layer, an active layer and an upper confinement layer;
    said upper confinement layer being doped with a p-dopant,
    said lower confinement layer being doped with a n-dopant; and
    said active layer being about 5 to about 30 period GRIN-SCH structure comprising a plurality of layers of $Ga_xIn_{1-x}N/GaN$ ($0 \leq x \leq 1$).

2. The multi-quantum well laser diode of claim 1, wherein said buffer layer is GaN.

3. The multi-quantum well laser diode of claim 2, wherein the GaN buffer layer is about 20–4000 Å.

4. The multi-quantum well laser diode of claim 1, wherein the lower confinement layer is about 3 μm thick.

5. The multi-quantum well laser diode of claim 4, wherein the lower confinement layer is GaN.

6. The multi-quantum well laser diode of claim 5, wherein the lower confinement layer is doped with an element selected from the group consisting of Si, Ge, S, or is co-doped.

7. The multi-quantum well laser diode of claim 1, wherein the upper confinement layer is about 0.25 μm thick.

8. The multi-quantum well laser diode of claim 7, wherein the upper confinement layer is doped with Mg.

9. The multi-quantum well laser diode of claim 8, wherein the upper confinement layer is GaN.

10. The multi-quantum well laser diode of claim 1, wherein the active layer is a plurality of successive GaInN/GaN layers.

11. The multi-quantum well laser diode of claim 1, wherein the active layers are a plurality of 33 Å GaInN layers, each such layer adjacent to a 66 Å GaN layers.

12. The multi-quantum well laser diode of claim 1, wherein the active layer comprises 10–20 successive GaInN/GaN layers in a GRINSCH structure.

13. The multi-quantum well laser diode of claim 1, wherein there is no Aluminum present in the buffer layer, upper confinement layer, lower confinement layer, and active layer.

14. The multi-quantum well laser diode of claim 1, wherein x=0.89.

15. A multi-quantum well laser diode comprising:
    a substrate, a buffer layer of GaN, a lower confinement layer of GaN:Si, an active layer and an upper confinement layer GaN:Mg;
    said active layer being an about 10 to about 20 period multiple quantum well GRINSCH structure comprising a plurality of layers of $Ga_xIn_{1-x}N/GaN$ ($X=0 \rightarrow 1$).

16. The multi-quantum well laser diode of claim 15, wherein X=0.89.

17. The multi-quantum well laser diode of claim 16, wherein each layer of GaInN is 33 Å thick and each layer of GaN is 66 Å thick.

* * * * *